United States Patent [19]

Chang

[11] 4,035,774
[45] July 12, 1977

[54] BISTABLE ELECTROLUMINESCENT MEMORY AND DISPLAY DEVICE

[75] Inventor: Ifay Fay Chang, Mahopac, N.Y.

[73] Assignee: International Business Machines Corporation, Armonk, N.Y.

[21] Appl. No.: 642,262

[22] Filed: Dec. 19, 1975

[51] Int. Cl.² .......................................... G06F 3/14
[52] U.S. Cl. .................. 340/166 EL; 340/174 YC; 340/324 M; 250/213 A
[58] Field of Search .... 340/166 EL, 324 R, 324 M, 340/174 YC; 250/213 R, 213 A, 551, 552; 315/169 TV

[56] References Cited

U.S. PATENT DOCUMENTS

| | | | |
|---|---|---|---|
| 3,207,905 | 9/1965 | Bray | 250/213 A |
| 3,321,631 | 5/1967 | Biard et al. | 250/213 A |
| 3,358,146 | 12/1967 | Ing, Jr. et al. | 250/213 A |
| 3,440,637 | 4/1969 | Molnar et al. | 250/213 A |
| 3,509,421 | 4/1970 | Holz | 315/169 TV |
| 3,812,486 | 5/1974 | Purchase | 340/324 M |
| 3,958,207 | 5/1976 | Tutihasi | 250/213 A |

*Primary Examiner*—Marshall M. Curtis
*Attorney, Agent, or Firm*—John A. Jordan

[57] ABSTRACT

An electroluminescent memory and display device which may be switched from a first stable state to a second stable state in response to a relatively low switching voltage, and which may be maintained in said second stable state by a relatively low alternating sustain voltage. Basically, the solid state arrangement comprises a photoconductive layer separating first and second electroluminescent layers. The first electroluminescent layer is fabricated from an electroluminescent material having an emission band within the range of the excitation band of the photoconductive material of the interposing photoconductive layer. The second electroluminescent layer is fabricated from an electroluminescent material having an emission band outside of the range of the excitation band of the photoconductive material of the interposing photoconductive layer. Typically, the electroluminescent material of the second electroluminescent layer has an emission band in the visible range suitable for display purposes.

20 Claims, 15 Drawing Figures

BISTABLE ELECTROLUMINESCENT MEMORY AND DISPLAY DEVICE

BACKGROUND OF THE INVENTION

1. Field of the Invention

The present invention relates to electroluminescent memory and display arrangements. More paticularly, the present invention relates to electroluminescent devices exhibiting a bistable memory characteristic sufficient to permit electroluminescence to be sustained by an alternating sustain signal.

2. Description of the Prior Art

Solid state electroluminescent materials are considered highly attractive for display device applications and the like. In the main, this is due to the fact that such materials exhibit high efficiencies and relative ease in fabrication. For example, a typical electroluminescent phosphor shows an efficiency of 18–20 lumens/watt. In this regard, even electroluminescent thin films show efficiencies on the order of 1 lumen/watt and there have been reports of possibly 3 lumens/watt. This may be contrasted, for example, to gas panel displays which typically show 0.1 lumens/watt efficiency.

Traditionally, there have been two main problems associated with electroluminescent devices, i.e., they exhibit short life and require a high switching voltage and current. The short life problem has recently been considerably improved. The requirement for a high switching voltage and current is largely a result of the refreshed matrix addressed operation. Typically, utilization of electroluminescent films or layers in a matrix-addressed display operation necessitates the use of high-peak power drivers. Such drivers are generally quite expensive, if (practically) available at all.

Although some effort has been made in the prior art to obtain matrix-addressed electroluminescent storage-type devices with memory, in the main, this effort has resulted in devices which are generally unsatisfactory because of their complexity, cumbersomeness and inefficiency. For example, the U.S. Pat. No. 3,487,378 to Byatt discloses a matrix-addressed arrangement utilizing both electroluminescent and photoemissive materials. However, the Byatt arrangement utilizes a memory function based upon a charge storage mechanism. The Byatt function and operation depends upon a relatively complex structure providing results more elaborate than necessary for a simple matrix-addressed electroluminescent display.

Likewise, U.S. Pat. No. 3,358,185 to Lally and U.S. Pat. No. 3,848,247 to Sherr each describe electroluminescent display arrangements involving the combination of electroluminescent and photoconductive materials and point addressing. However, the devices disclosed by Lally and Sherr exhibit the same disadvantages as the above-mentioned Byatt device. In addition, Lally and Sherr do not provide any basic memory or storage mechanism.

In addition to the above-mentioned electroluminescent display devices, the prior art has also utilized electroluminescent-photoconductive combinations in light amplifier-like devices. One such device has been described by Kazan and Nicoll in an article entitled "Solid State Light Amplifiers," appearing in J. Opt. Soc. Am 47, 887–894, 1957. In this light-amplifier arrangement, a light image projected onto the photoconductive material triggers into an "on" condition the photoconductive-electroluminescent combination, thereby maintaining the image by electroluminescence. However, in such devices, the stability is poor due to the fact that the electroluminescent emission, the ambient light and the photoconductive excitation band are all in the visible range and are overlapping.

A variation in the above-mentioned photoconductive-electroluminescent light amplifier device was subsequently suggested by Kazan in PROC. IRE, 47, 12, 1959. In this latter arrangement, two layers of electroluminescent material are used for light amplification. However, this arrangement, as with previously mentioned electroluminescent memory schemes, suffers from the fact that complicated optical and electrical isolation necessarily had to be utilized in order to achieve bistability. Another bistable electroluminescent arragement typifying the prior art approaches is that described by Janning in U.S. Pat. No. 3,492,549. The Janning bistable electroluminescent arrangement utilizes an insulated gate field effect semiconductor to apply an electric field across the electroluminescent phosphor layer whereby the electroluminescent phosphor layer becomes polarized. The polarized condition of the electroluminescent phosphor layer corresponds to one stable state, while the unpolarized condition of the electroluminescent phosphor layer corresponds to another stable state. In the Janning device, in order to switch to the polarized state, not only is an electric field required to be applied across the electroluminescent phosphor layer but, in addition, a light source is required to simultaneously illuminate the phosphor layer. As can be seen, both the mode of operation and structure of the Janning electroluminescent memory arrangement are optically and electrically complex.

The U.S. Pat. No. 3,432,724 to Frost typifies the matrix-addressed electroluminescent display devices of the prior art which exhibit virtually no memory characteristics, i.e., exhibit no bistability. Not only do electroluminescent display devices of this type suffer from the requirement of high-switching voltage and high-peak current but, in addition, also suffer from scanning and size limitations. As is evident, the scanning requirement, which comes about because of the absence of any memory characteristic, necessitates the use of relatively complex switching circuitry. Typical of the further problems incident the electroluminescent display devices of the Frost variety is the problem of spurious electroluminescent effects or cross effects due to innerelectrode capacitive coupling which causes emission to occur along the row and column selected for generating relatively bright luminescence.

SUMMARY OF THE INVENTION

In accordance with the principles of the present invention, a relatively simple electroluminescent memory and display device is provided which can be switched to its "on" state by a relatively low magnitude and simple switching voltage, and thereafter maintain in its "on" state by a relatively low voltage sustain signal. Accordingly, the electroluminescent device of the present invention exhibits an inherent memory characteristic or effect which obviates the need for high-peak current and high-switching voltages typically required for achieving reasonable time-averaged brightness in matrix-addressed electroluminescent display arrangements.

The memory charactristic of the present invention is achieved by utilizing a layer of photoconductive material interposed between first and second layers of electroluminescent material. The first layer of electroluminescent material has a light-emission band within the range of the excitation band of the layer of photoconductive material. The second layer of electroluminescent material has a light-emission band outside the range of the layer of photoconductive material and typically in the visible range suitable for display purposes.

With the application of the relatively low sustaining voltage across the first and second electroluminescent layers with interposed photoconductive layer, the electroluminescence therefrom is relatively weak because of the fact that a large portion of the voltage excitation is dropped across the photoconductive layer, the latter being in a high impedance due to the relatively weak luminescence from the first electroluminescent layer. Upon the application of a switching voltage, the emission from the first electroluminescent layer is increased which, in turn, excites the photoconductive layer. A regenerative optical-electrical coupling feedback effect is thereby induced between the first electroluminescent layer and the photoconductive layer whereby the amount of switching voltage dropped across the photoconductive layer rapidly decreases and the amount of voltage dropped across the first and second electroluminescent layers rapidly increases. When the photoconductive material is in its fully conductive state, the device has switched to a stable on condition and the sustain voltage acts to produce sufficient electroluminescence from the first electroluminescent layer to maintain the photoconductive material fully conductive even after the switching voltage has been removed.

It is, therefore, an object of the present invention to provide an electroluminescent memory cell.

It is a further object of the present invention to provide an improved electroluminescent display device.

It is yet a further object of the present invention to provide an electroluminescent display device exhibiting a memory characteristic.

It is yet still a further object of the present invention to provide an electroluminescent display device which requires relatively low switching voltages and peak currents.

It is another object of the present invention to provide a large area matrix-addressed elecctroluminescent display panel which operates with relatively low switching voltages and peak currents.

It is yet another object of the present invention to provide a display device which exhibits a high light efficiency and good memory characteristics.

It is yet still another object of the present invention to provide a solid state, matrix-addressed display device which has memory and which exhibits high brightness in a variety of colors.

It is yet a further object of the present invention to provide a matrix-addressed electroluminescent memory and display panel wherein points or "cells" within the panel may be selectively addressed into an on or luminescent state in response to a write voltage and maintained in this state in response to a relatively low sustain voltage common to all of the cells.

The foregoing and other objects, features and advantages of the invention will be apparent from the following more particular description of the preferred embodiments of the invention as illustrated in the accompanying drawings.

DETAILED DESCRIPTION OF THE DRAWINGS

Figure 1:
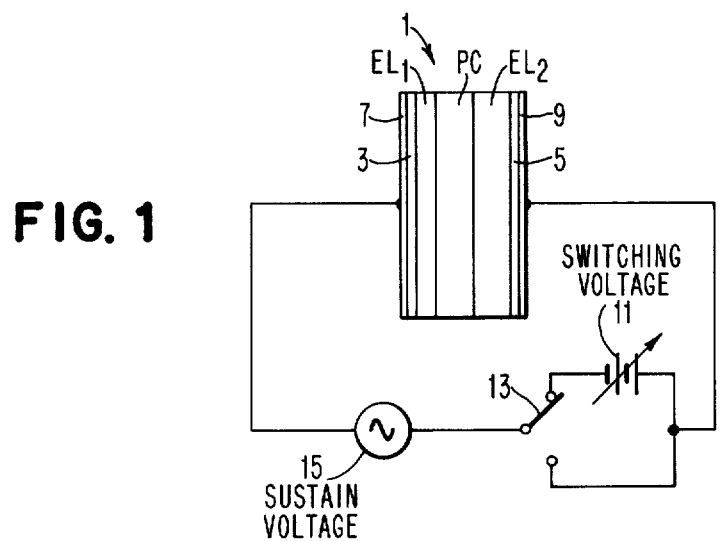
FIG. 1 shows the basic electroluminescent memory and display cell device in accordance with the present invention.

The basic electroluminescent memory cell, in accordance with the principles of the present invention, is shown by the edge-view at 1 in FIG. 1. The three key or essential elements are first and second electroluminescent layers separated by a photoconductive layer. As shown in FIG. 1, the first electroluminescent layer is designated $EL_1$ and the second electroluminescent layer is designated $EL_2$. The interposing photoconductive layer is labeled PC. The outer surfaces of the first and second electroluminescent layers $EL_1$ and $EL_2$ respectively, are covered with Dielectric Layers 3 and 5, respectively. The Dielectric Layers 3 and 5 are in turn covered by Conductors 7 and 9. The cell layers may be of a rectangular or circular configuration in their area dimension. A switching voltage may be applied across the cell by moving Switch 13 to its upward position, as shown. With Switch 13 in its upward position, Alternating Sustain Voltage 15 is added in series therewith. With Switch 13 in its downward position, only Alternating Sustain Voltage 15 is applied to the cell.

It should be recognized that the particular configuration shown in FIG. 1 is illustrative only and is intended to show the manner in which the first and second electroluminescent layers $EL_1$ and $EL_2$ cooperate with the photoconductive layer to provide a bistable memory and display device. It is evident that the bistable memory and display effect provided by the first and second electroluminescent layers and the photoconductive layer may be implemented in any of a variety of specific configurations. In the simple cell shown in FIG. 1, electroluminescent layer $EL_1$ is selected to stimulate the photoconductive layer PC, while the electroluminescent layer $EL_2$ is selected to provide output luminescence typically in the visible range. In order to obtain an optical output from $EL_2$, Dielectric Layer 5 and Conductive Layer 9 are chosen to be transparent to this output. Typically, Dielectric Layer 5 may comprise a dielectric glass layer and Conductive Layer 9 may comprise a layer of tin oxide, for example. In this regard, it may be desirable to fabricate Dielectric Layer 3 and Conductive Layer 7 in the same manner as Layers 5 and 9 are fabricated.

The electroluminescent material of $EL_1$ is selected so that it has an emission band within the range of, or overlapping with, the excitation band of photoconductive layer PC but typically is outside of the range of the emission band of electroluminescent layer $EL_2$. The electroluminescent material of $EL_2$, on the other hand, is selected so that it has an emission band outside the range of the excitation band of photoconductive layer PC. Thus, the emission band of $EL_2$ could have some overlap with the emission band of $EL_1$ so long as it is outside the range of the excitation band of photoconductive layer PC.

Typically, photoconductive materials for photoconductive layer PC having an excitation band in the UV to blue range or in the infrared range woul be satisfactory. As is known to those skilled in the art, photoconductive materials within these ranges are readily available. However, it should be understood that any photoconductive material may be utilized so long as there exists an electroluminescent material having an output emission band which will excite this photoconductive material and for which there exists an output electroluminescent material $EL_2$, which has an emission band outside the excitation band of this photoconductive material. In this regard, it should also be understood that in the preferred mode $EL_2$ will comprise an electroluminescent material having an emission band in the visible range, but that it would readily be possible to utilize an electroluminescent material in $EL_2$ which has an emission band outside of the visible range. In this latter instance, various detection schemes could be employed to detect this emission. In such an arrangement, the cell shown in FIG. 1 might act as simply a storage device with optical output while some form of optical detector at the optical output would act as a transducer to convert the optical output to an electrical output, or to amplify the optical output, to some form of recognizable indication of the state of the cell through the use of photographical instruments, electrical recorder and display or image amplifier devices.

The importance of having the emission band of $EL_2$ outside the excitation band of photoconductor layer PC will be appreciated when it is recognized that the regenerative feedback mechanism between $EL_1$ and PC, required for bistability, should be optically and electrically isolated from $EL_2$ in order to insure stable operation. In this regard, it should be noted that the function of $EL_1$ is to excite PC with a relatively gradual emission which ultimately does not need to be strong so long as it is effectively matched to the excitation band of PC. On the other hand, the function of $EL_2$ is to provide a strong emission which has minimal effect upon PC and which typically is in the visible range of emission.

Figure 2A:
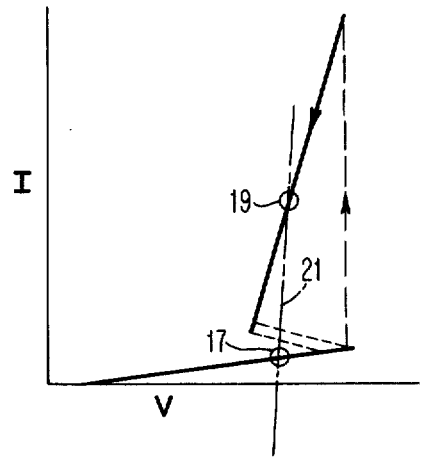
FIG. 2A shows the I-V bistable switching characteristics of the electroluminescent memory cell device, in accordance with the present invention.

Assuming the cell device of FIG. 1 is in its low current "off" state, then Alternating Sustain Voltage 15 acts to maintain the device at quiescent state 17 shown in FIG. 2A. Under such conditions, Switch 13 is in its downward position, so that Switching Voltage 11 is out of the circuit. It should be noted, in this regard, that Alternating Sustain Voltage 15 may comprise any of a variety of alternating signals. For example, Source 15 may comprise any of a variety of pulse waveforms or time varying DC, as well as sinusoids and the like. The only requirement is that Source 15 provide a signal which reverses direction.

With only the sustain voltage applied across Cell 1, the electroluminescence of Layers $EL_1$ and $EL_2$ is quite weak due to the fact that the major part of the sustain voltage excitation is dropped across the photoconductive layer PC which is in a high impedance condition. The weak electroluminescence from $EL_1$ is not sufficient to excite Photoconductive Layer PC. To switch to the second stable state, Switch 13 in FIG. 1 is moved to its upward position. With Switch 13 in its upward position, Switching Voltage 11 is switched into the circuit in series with Sustain Voltage 15. In this regard, Switching Voltage 11 has been represented by a variable DC source. It should be understood that any of a variety of signals may be used for the switching voltage, so long as it causes $EL_1$ to emit. Thus, Switching Voltage 11 may range from a DC signal to a signal having a different frequency than the Sustain Signal 15.

As the switching voltage is applied across Cell 1, the electroluminscence from $EL_1$ is enhanced which in turn excites the Photoconductive Layer PC into further conduction. As the Photoconductive Layer PC becomes more conductive, more of the voltage excitation is dropped across electroluminescent Layrs $EL_1$ and $EL_2$. With an increased voltage drop across Layers $EL_1$ and $EL_2$, their emission is greatly increased. With further increase in emission of Layer $EL_1$, photoconductive layer PC becomes even more conductive, and so on. The current-voltage path traversed during this regenerative process is shown in FIG. 2A wherein the cell is switched from Point 17 to Point 19 via the path shown by the arrows. At Point 19, photoconductive layer PC is fully conductive and stabilized into an equilibrium condition by the emission of $EL_1$, whereby the second stable state of the cell is reached. The cell maintains itself in the second stable state even after Switching Voltage 11 is removed from the circuit (by returning Switch 13 to its downward position), due to the fact that the increased excitation of $EL_1$ produces sufficient emission to maintain the photoconductive layer PC in its fully conductive state.

As can be seen from FIG. 2A, the voltage required to maintain Cell 1 at on stable Point 19 is the same as required to maintain Cell 1 at off stable Point 17 and is less than that required to switch the device to Point 19. As can be seen, Sustain Signal 15 is represented by Line 21. In the second stable state, electroluminescent layer $EL_1$ is at a sufficient level of excitation to hold the PC in its conductive state and thereby permit Sustain Voltage 15 to maintain this level of excitation. It is clear that where electroluminescent Layer $EL_2$ is selected to be in the visible range, the high degree of emission that occurs in this state may readily be viewed directly through Dielectric Layer 5 and Conductive Layer 9.

Figure 2B:
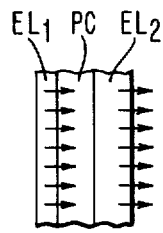
FIG. 2B shows the juxtaposition and function of the first and second electroluminescent layers on opposite sides of a photoconductive layer.

FIG. 2B illustrates the excitation and emission relationship between the three active layers of Cell 1. As can be seen from the arrows in FIG. 2B, electroluminescence from layer $EL_1$ excites Photoconductive Layer PC, since Photoconductive Layer PC is selected to have a range of excitation within the emission band of $EL_1$. Electroluminescent Layer $EL_2$, on the other hand, has an emission band outside of the emission band of $EL_1$ and the excitation band of PC. Typically, the emission band of $EL_2$ would be in the visible range.

Figure 2C:
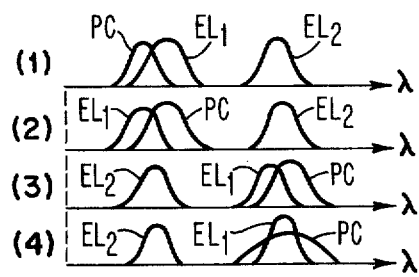
FIG. 2C illustrates the excitation and emission relationship between the three basic layers shown in FIG. 2B.

It should be understood that "within," as used herein with respect to defining the relationship of the emission bands of $EL_1$ and $EL_2$ to one another and to the photoconductor PC, is intended to mean being partially contained in or having some degree of optical overlap with, as shown in FIG. 2C. In contradistinction to this, "outside," as used herein, is intended to mean being nonoverlapping or completely outside, i.e., having no optical overlap with or coupling to, again, as shown in FIG. 2C.

In FIG. 2C, there is shown various combinations of the excitation and emission relationship mentioned in FIG. 2B. As can be seen, in the first combination shown as on Plot (1) the excitation band of PC is slightly lower than the emission band of $EL_1$ in wavelength scale, but there is considerable overlap between the two. The emission band of $EL_2$, as shown, is considerably higher than either of the other two bands. In Plot (2) of FIG. 2C, the emission band of $EL_1$ is slightly less than the excitation band of PC but, again, the required overlap exists. As shown, the emission band of $EL_2$ is considerably higher than either other band. In Plot (3), it can be seen that the emission band of $EL_2$ is lower than the emission band of $EL_1$ or excitation band of PC with the excitation band of PC being slightly higher (or lower, not shown) than $EL_1$ but with the necessary overlap present. In Plot (4), the emission band of $EL_2$ is, again, lower than the emission band of $EL_1$ or excitation band of PC with the excitation band of PC completely overlapping the emission band of $EL_A$ but still outside of the emission band of $EL_2$.

Figure 3A:
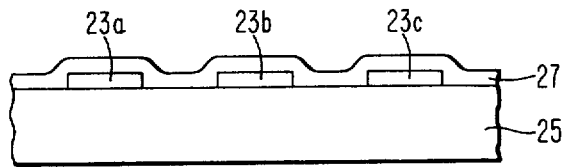
FIGS. 3A – 3E show one manner in which the electroluminescent memory and display device, in accordance with the principles of the present invention, may be implemented in a matrix-addressed display panel.
Figure 3B:
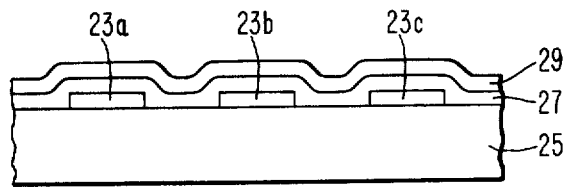

In FIGS. 3A–3E, there is shown the steps for one way in which Cell 1 described in FIG. 1 may be implemented in a matrix-address array. Typically, such arrays are used for storage and display purposes. As shown in the edge view of FIG. 3A, Conductors 23A–23C are deposited upon an Insulating Substrate 25. Although Substrate 25 may comprise any number of a variety of materials, typically it may be fabricated from glass. Conductive Lines 23A–23C, as shown, extend into the plain of the paper. Dielectric Layer 27 is deposited over the Conductive Lines 23A–23C. In FIG. 3B, a continuous electroluminescent Layer 29 is shown deposited over Dielectric Layer 27 orthogonal to the Conductive Lines 23A–23C. Alternatively, there could be a plurality of parallel Strips of the form 29a, 29b . . . . As a further alternative, the Electroluminescent Strips may readily be further subdivided into islands of electroluminescent material in registry with the Conductive Lines 23A–23C. Typically, such islands may be in rectangular or circular configuration. Electroluminescent Strip 29 may correspond to Layer $EL_1$ in FIG. 1.

Figure 3C:
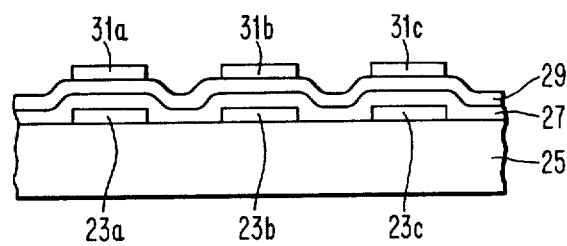
Figure 3D:
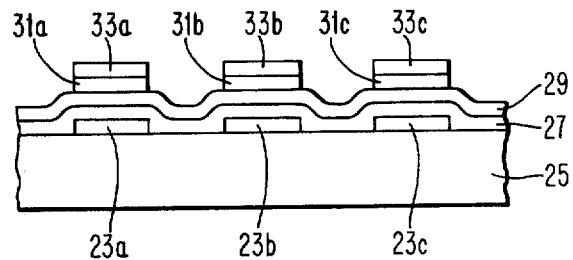
Figure 3E:
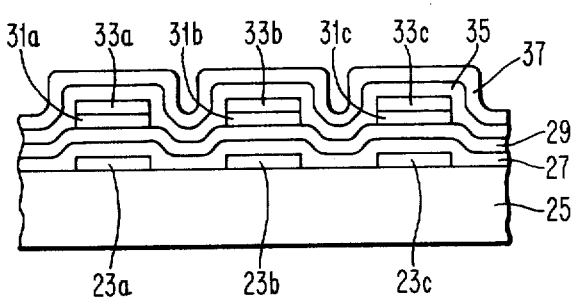

In FIG. 3C, line strips of photoconductive material 31A–31C are shown deposited over Electroluminescent Strips 29a, 29b . . . . Photoconductive Line Strips 31A–31C are shown as being parallel to and in registry with Conductive Lines 23A–23C. However, the photoconductive line strips may be orthogonal to Conductive Lines 23A–23C or, alternatively, may comprise islands of photoconductive material in registry with Conductive Lines 23A–23C or simply as a continuous layer. In FIG. 3D, Electroluminescent Line Strips 33A–33C are shown deposited upon Photoconductive Line Strips 31A–31C, in parallel with Conductors 23A–23C. Alternatively, the electroluminescent layer may be deposited as strips orthogonal to the PC strips or as islands in registry with Conductors 23A–23C, or as a continuous plane. The electroluminescent material of Lines 33A–33C may correspond to the Electroluminescent Layer $EL_2$ in FIG. 1. The various alternative interlayer configurations provide the possibility of optimizing the excitation coupling between $EL_1$ and PC and emission definition of $EL_2$.

Thereafter, a Layer of Dielectric Material 35 is deposited over the entire area of the matrix-address memory and display arrangement so as to cover the various lines and regions in between. It is evident that where the electroluminescent material of Line Strips 33A–33C corresponds to $EL_2$ in FIG. 1, the Dielectric Material 25 may be transparent to visible light so as to permit viewing of the addressed points where $EL_2$ is selected to be in the visible range. As a final step, conductive lines, one of which is shown at 37 in FIG. 3A, are deposited upon Dielectric Layer 35 parallel to one another and orthogonal to Conductive Lines 23A–23C. Again, where Electroluminescent Material 33A–33C is selected to be in the visible range, Conductive Lines 37 are made of transparent material.

FIGS. 4A–4E show the steps of a further way in which the cell arrangement described in FIG. 1 may be expanded into a two-dimensional matrix-address arrangement. The scheme shown in FIGS. 4A–4E is a variation of that shown in FIGS. 3A–3E. The key distinction resides in the fact that rather than deposit the materials of the various lines and layers in a planar-type approach, the materials are deposited in grooves or channels in Substrate 40, as shown, for example, in FIG. 4A. One advantage in using such an approach resides in the fact that good isolation exists between the various lines. Accordingly, deleterious effects such as interelectrode capacitive coupling and cross-talk are minimized. In this regard, Substrate 40 may comprise any of a variety of insulating materials, such as glass.

Figure 4A:
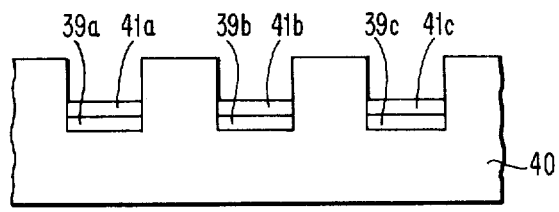
FIGS. 4A – 4E show another manner in which the electroluminescent memory and display device, in accordance with the principles of the present invention, may be implemented in a further matrix-address display panel.

In a manner analogous to the first step described in FIG. 3A, the first step in FIG. 4A requires deposition of Conductive Lines 39A–39C. It should be understood that the arrangement shown in both FIGS. 3A–3E and 4A–4E represent fragmentary views. Thus, although FIG. 4A, for example, shows only three line strips of Conductive Lines 39A–39C, it should be understood that typically, a matrix-address array would utilize many more lines in both the x and y directions. For simplicity's sake, only three line strips are being described here.

Figure 4B:
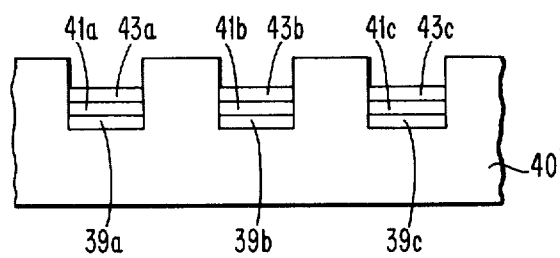
Figure 4C:
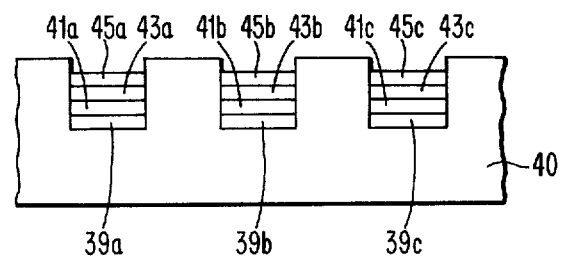
Figure 4D:
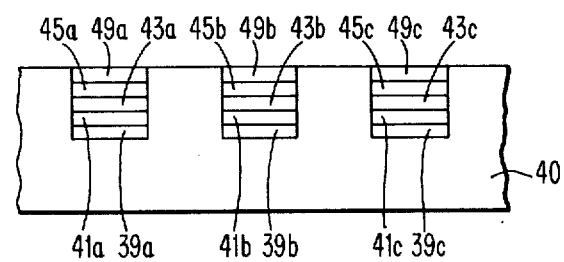
Figure 4E:
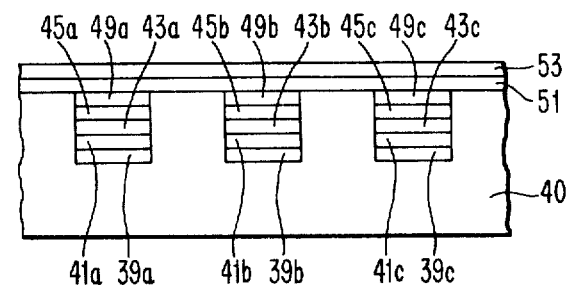

After Conductive Lines 39A–39C have been deposited in the grooves or channels of Substrate 40, dielectric material forming Dielectric Lines 41A–41C is deposited on top of the conductive lines. Following the deposition of the Dielectric Lines 41A–41C, line strips or rectangular islands of electroluminescent material are deposited upon the dielectric strips equidistant from one another down the line of the channels. The edge ones of the rectangular islands of electroluminescent material are shown in FIG. 4B as Electroluminescent Layer 43A–43C. Typically, these rectanglar islands of electroluminescent material would have a length of approximately equal to the width of the channels. The islands of electroluminescent material used here may comprise material corresponding to that used for electroluminescent Layer $EL_1$, shown in FIG. 1. After the deposition of the Electroluminescent Layer 43A–43C, either Photoconductive Line Strips or Islands 45A–45C are deposited in the grooves on the electroluminescent material, as shown in FIG. 4C. Where the underlying electroluminescent material has been deposited as islands of electroluminescent material, it is convenient to, likewise, deposit the photoconductive material as coextensive islands in registry with the electroluminescent material.

Following the deposition of the Photoconductive Line Strips or Islands 45A–45C, Electroluminescent Line Strips or Islands 49A–49C are deposited in the array of grooves on the photoconductive material. Where the underlying electroluminescent material and photoconductive material have been deposited as rectangular islands, again it is convenient to deposit the electroluminescent material here as coextensive islands in registry therewith. Electroluminescent Line Strips or Islands 49A–49C may correspond to the electroluminescent material of electroluminescent layer $EL_2$, shown in FIG. 1. After the second electroluminescent Layer has been deposited, a layer of Dielectric Material 51 is deposited to cover the entire substrate including the filled grooves. Thereafter conductive lines are deposited upon the dielectric material parallel to one another in a direction orthogonal to the direction of Conductor Lines 39A–39C. The edgemost conductor is shown as Conductor Lines 53 in FIG. 4E. As hereinabove mentioned, where Electroluminescent Line Strips or Islands 49A–49C are chosen to give emission in the visible range, Dielectric Material 51 and the conductors represented by 53 are made of transparent material.

FIG. 4 A–E is one way of achieving good $EL_1$-PC coupling and $EL_2$ emission definition. It should be understood that the groove structure could be made to contain only the $EL_1$ layer (thus allowing PC and $El_2$ to be deposited as continuous layers) or $EL_1$ and PC layers (thus allowing $EL_2$ to be deposited as a continuous layer). The choice simply depends on the degree of isolation required in the sandwich structure and whether $El_2$ or PC is in a thick film or binded powder form.

Another FIG. 3A–E and FIG. 4A–E have been described in terms of first depositing $EL_1$ on the substrate and building up to $EL_2$, it should be recognized that it may be desirable to use the reverse procedure. Thus, the process would start with a transparent substrate with supporting transport conductors and $EL_2$ would then be deposited, and then PC, $EL_1$, etc.

It should be appreciated that a matrix-addressed electroluminescent memory and display device, made in accordance with the principles of the present invention, is capable of supporting an optical write mode, such as may be achieved with a light pen for interactive applications. Such a mode could readily be achieved by making electroluminescent layer $EL_1$ photoluminescent. In this regard, it is clear that $EL_1$ may be selected to exhibit both photoluminescence and electroluminescence, since it is understood that materials are known which exhibit both characteristics. Typical of the examples that may be used for the electroluminescent material in accordance with the principles of the present invention are Si, SiC, ZnS, ZnSe, CdS, CdSe, GaN, GaAs, GaP, AlN, InP, and InAs. Likewise, typical of the examples of photoconductive material that may be used in accordance with the principles of the present invention are PbS, PbSe, Si, Ge, Se, Te (and mixture) PbO, GdS, ZnS, ZnSe, CdS, and CdSe. It is clear that mixtures or alloys of the above materials can be chosen to give the desired excitation or emission band characteristics.

The above-listed electroluminescent and photoconductive materials respectively exhibit emission bands and excitation bands ranging from UV to IR. In addition to these materials, it is clear that certain known organic photoconductive materials exhibiting high gain may also be utilized. Where the spectral separation of the emission band of the material selected for the $EL_2$ layer is not far enough from the excitation band of the material selected for the PC layer, a reflecting layer may be added between the $EL_2$ and PC layers.

Figure 5:
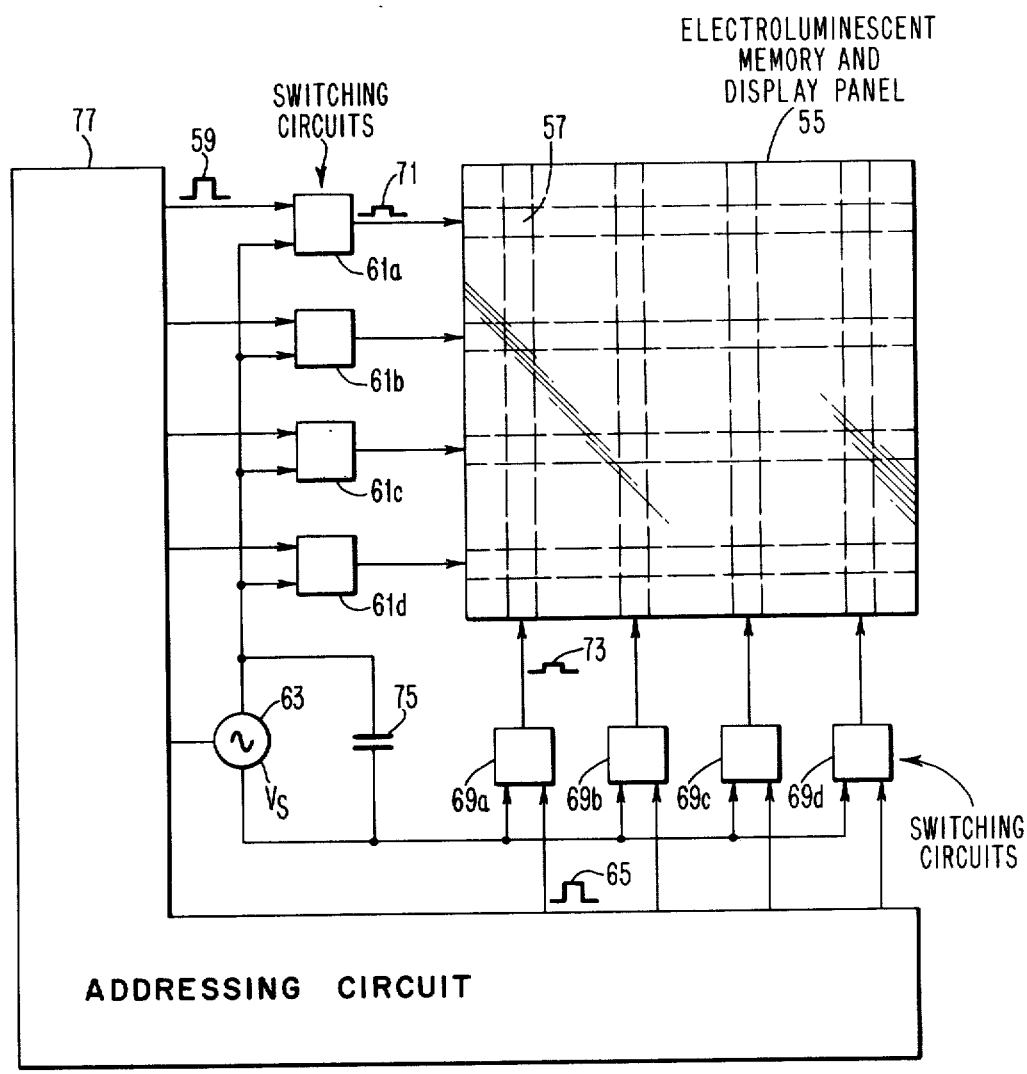
FIG. 5A shows the manner in which the matrix-address display panel may be selectively addressed with a switching voltage and sustained with a common sustain voltage.

In FIG. 5, there is shown a matrix-address arrangement exemplary of those that may be implemented using the electroluminescent memory and display cell device, in accordance with the principles of the present invention. In many respects, the memory characteristic described herein may be analogized to the memory characteristic of gas panel display devices. One of the significant aspects of this memory characteristic is that any cell within an array of cells may be addressed or written via a write pulse, and thereafter sustained by a common sustain signal. In FIG. 5, Electroluminescent Memory and Display Panel 55 is addressed in a manner akin to that employed in gas panel addressing. In this regard, the particular structure of Electroluminescent Memory and Display Panel 55 is not important, it being understood that the intersections of the various horizontal and vertical lines correspond to a bistable cell structure like that shown in FIG. 1. In operation, where the cell designated 57, for example, is to be addressed, a Control Pulse 59 is gated from Addressing Circuit 77 to Switching Circuit 61a whereby a half select switching voltage or Write Pulse 71 is added in series to the sustain signal being applied to Switching Circuit 61a via Alternating Sustain Signal 63. Likewise, simultaneous with the application of Control Pulse 59, a Control Pulse 65 from Addressing Circuit 77 is applied to Switching Circuit 69a whereby the other half of the half select write signal is addressed in series to the sustain voltage applied to Switching Circuit 69a via Sustain Source 63. With the simultaneous application of half select write Pulses 71 and 73 to Cell 57, the cell is induced to switch from its off stable state to its on stable state. Once Cell 57 has been switched to its on state, the sustain signal from Sustain Signal Source 63, commonly applied to all of the lines, via Switching Circuits 61 and 69, is sufficient to maintain Cell 57 in its on condition. It should be appreciated that in order to lessen the effect of variable capacitance loading on the Sustaining Signal Source 63, a Capacitance 45 may be connected in shunt with Panel 55.

Thus, with the electroluminsecent memory characteristic provided in accordance with the present invention, an electrolumminsecent memory and display panel may be selectively written into its on state by a relatively low voltage switching signal, and thereafter maintained in its on state with a relatively low voltage sustain signal. Any of a variety of schemes may be employed to erase a cell previously written. For example, half select pulses of opposite polarity to the write pulses may be used to erase the cell.

While the invention has been particularly shown and described with reference to preferred embodiments thereof, it will be understood by those skilled in the art that various changes in form and details may be made therein without departing from the spirit and scope of the invention.

I claim:

1. An electroluminescent memory element, comprising;
   a first layer of electroluminescent material;

a layer of photoconductive material having an excitation band within the emission band of said first layer of electroluminescent material and positioned adjacent thereto;

a second layer of electroluminescent material having an emission band outside the excitation band of said layer of photoconductive material and positioned adjacent said layer of photoconductive material and said first layer of electroluminescent materal to form a plurality of layers; and means to apply voltage potential across said plurality of layers so that the memory element formed thereby may be caused to operate in either of two stable memory states.

2. The electroluminescent memory element of claim 1 wherein said first and second layers of electroluminescent material have nonoverlapping emission bands.

3. The electroluminescent memory element of claim 1 wherein one side of said layer of photoconductive material is positioned adjacent to said first layer of electroluminescent material and in contact therewith and wherein the other side of said second layer of photoconductive material is positioned adjacent to said second layer of electroluminescent material and in contact therewith.

4. The electroluminescent memory element of claim 3 wherein said second layer of electroluminescent material has an emission band in the visible range.

5. The electroluminescent memory element of claim 4 wherein said means to apply voltage potential across said plurality of layers include a layer of transparent conductive material adjacent said second layer of electroluminescent material.

6. The electroluminescent memory element of claim 5 wherein said means to apply voltage potential across said plurality of layers further include a layer of transparent dielectric material interposing said layer of transparent conductive material and said second layer of electroluminescent material.

7. An electroluminescent memory cell with optical output, comprising;

a first layer of electroluminescent material;

a layer of photoconductive material having an excitation band within the emission band of said first layer of electroluminsecent material and being positioned adjacent thereto;

a second layer of electroluminescent material having an emission band outside the excitation band of said layer of photoconductive material and being positioned adjacent thereto to form a plurality of layers of material;

conductive electrode means adjacent to and on opposite sides of said plurality of layers of material for applying a voltage potential across said layers; and means to apply voltage potential including a bias potential to said conductive electrode means whereby the memory cell formed thereby may be caused to operate in either of two stable memory states.

8. The electroluminescent memory cell of claim 7 wherein said first layer of electroluminescent material is positioned adjacent one side of said layer of photoconductive material and said second layer of electroluminescent material is positioned adjacent the other side of said layer of photoconductive material.

9. The electroluminescent memory cell of claim 8 wherein said first and second layer of electroluminescent material are positioned in direct contact with said layer of photoconductive material.

10. The electroluminescent memory cell of claim 9 wherein said means to apply voltage potential to said conductive electrode means includes means to apply both a sustain voltage potential and a switching voltage potential.

11. The electroluminescent memory cell of claim 10 wherein said conductive electrode means adjacent to and on opposite sides of said layers of material comprise discrete areas of conductive material selectively addressable by said switching voltage.

12. The electroluminescent memory cell of claim 11 wherein said second layer of electroluminescent material has an emission band in the visible range.

13. The electroluminescent memory cell of claim 12 wherein the said conductive electrode means adjacent to and on the side of said second layer of electroluminescent material comprises transparent conductive electrode means.

14. The electroluminescent memory cell of claim 13 wherein said first and second layers of electroluminescent material have nonoverlapping emission bands.

15. The electroluminescent memory cell of claim 14 wherein a layer of dielectric material interposes each of said conductive electrode means and respective ones of said first and second layers of electroluminescent material with the said dielectric material interposed between the respective one of said conductive electrode means and said second layer of electroluminescent material comprising a transparent dielectric material.

16. The electroluminescent memory cell as set forth in claim 15 wherein said layer of photoconductive material has an excitation band in the UV to blue range and the said first layer of electroluminescent material has an emission band within the said UV to blue range of excitation of said layer of photoconductive material.

17. A bistable electroluminescent memory device; comprising;

a layer of photoconductive material responsive to electroluminescent emission to change from a low conductive condition to a higher conductive condition;

a first layer of electroluminescent material adjacent said layer of photoconductive material and having an electroluminescent emission band within the excitation band of said layer of photoconductive material so that upon application of sufficient voltage thereacross an electroluminescent emission therefrom causes said layer of photoconductive material to go from said low conductive condition to a higher conductive condition causing said memory device to switch from a first stable state to a second stable state;

a second layer of electroluminescent material adjacent said layer of photoconductive material and having an electroluminescent emission band outside the excitation band of said layer of photoconductive material so that when said layer of photoconductive material is in said low conductive condition, and said memory device is in said first stable state there is insufficient voltage across said second layer of electroluminescent material to cause emission therefrom and when said layer of photoconductive material is in said high conductive condition and said device is in said second stable state there is sufficient voltage across said second layer of electroluminescent material to cause electroluminescent emission therefrom indicative of said second stable state;

means to apply a switching voltage across said device to switch said device from said first stable state to said second stable state; and means to apply a sustain voltage across said device to sustain electroluminescent emission from said first and second layers of electroluminescent material when said device is in said second stable state.

18. A bistable electroluminescent memory and display device having first and second stable states, comprising:

a first layer of electroluminescent material;

a layer of photoconductive material having an excitation band within the emission band of the said electroluminescent material of said first layer of electroluminescent material and positioned adjacent to said first layer of electroluminescent material to form combined layers thereof so that the electroluminescent emission from said layer of electroluminescent material causes said layer of photoconductive material to go from a nonconductive condition to a conductive condition;

a second layer of electroluminescent material having an emission band outside the excitation band of the said photoconductive material of said layer of photoconductive material and positioned adjacent to said layer of photoconductive material to form combined layers thereof;

electrode means coupled to opposite sides of the said combined layers to apply a potential thereacross;

means to apply a time varying sustain voltage to said electrode means to apply a potential thereacross sufficient to sustain electroluminescent emission whenever said device is in said second stable state but insufficient to sustain electroluminescent emission whenever said device is in said first stable state; and means to apply a switching voltage and said electrode means to switch said device from said first stable state to said second stable state.

19. The bistable electroluminescent memory and display device as set forth in claim 18 wherein said second layer of electroluminescent material has an emission band in the visible range.

20. The bistable electroluminescent memory and display device as set forth in claim 18 wherein said electrode means comprise horizontal and vertical conductors on opposite sides of said combined layers to form a matrix-address display device having selectably addressable points addressable to said second stable state in response to said switching voltage and sustainable in said second stable state by said sustain voltage.

* * * * *